US 6,613,664 B2

(12) United States Patent
Barth et al.

(10) Patent No.: US 6,613,664 B2
(45) Date of Patent: Sep. 2, 2003

(54) BARBED VIAS FOR ELECTRICAL AND MECHANICAL CONNECTION BETWEEN CONDUCTIVE LAYERS IN SEMICONDUCTOR DEVICES

(75) Inventors: Hans-Joachin Barth, Munich (DE); Erdem Kaltalioglu, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,552

(22) Filed: Dec. 28, 2000

(65) Prior Publication Data

US 2002/0086523 A1 Jul. 4, 2002

(51) Int. Cl.⁷ .......................................... H01L 21/4763
(52) U.S. Cl. ..................... 438/629; 438/637; 438/687
(58) Field of Search .......................... 438/640, 629, 438/637–641, 672–676, 687

(56) References Cited

U.S. PATENT DOCUMENTS

| 5,354,712 A | * | 10/1994 | Ho et al. ..................... 438/127 |
| 5,470,790 A | * | 11/1995 | Myers et al. ................ 257/774 |
| 6,159,851 A | * | 12/2000 | Chen et al. .................. 438/669 |
| 6,218,283 B1 | * | 4/2001 | Park et al. ................... 438/622 |

* cited by examiner

Primary Examiner—Jey Tsai
(74) Attorney, Agent, or Firm—Slater & Matsil, L.L.P.

(57) ABSTRACT

A multi-layer integrated circuit (400) and method of manufacturing thereof having barbed vias (427) connecting conductive lines (468, 408). Circuit (400) includes a first dielectric layer (404) deposited on a substrate (402) and conductive lines (408) formed in the first dielectric layer (404). A second dielectric layer (462) is deposited over the first dielectric layer (404). Barbed vias (427) are formed having a substantially cylindrical portion (424) within the second dielectric layer (462) and a barbed portion (426) within conductive lines (408). Conductive lines (468) are formed over the barbed vias (427) within the second dielectric layer (462). A region of the barbed via (427) barbed portion (406) extends beneath the second dielectric layer (462).

17 Claims, 5 Drawing Sheets

BARBED VIAS FOR ELECTRICAL AND MECHANICAL CONNECTION BETWEEN CONDUCTIVE LAYERS IN SEMICONDUCTOR DEVICES

TECHNICAL FIELD

The present invention relates generally to the fabrication of semiconductor devices, and more particularly to via formation in multi-layer integrated circuits.

BACKGROUND OF THE INVENTION

Semiconductors are widely used for integrated circuits for electronic applications, including radios, televisions and personal computing devices, as examples. Such integrated circuits typically use multiple transistors fabricated in single crystal silicon. It is common for there to be millions of semiconductor devices on a single semiconductor product. Many integrated circuits now include multiple levels of metallization for interconnections.

The semiconductor industry continuously strives to decrease the size of the semiconductor devices located on integrated circuits. Miniaturization is generally needed to accommodate the increasing density of circuits necessary for today's semiconductor products. In the past, the material typically used to isolate conductive leads from each other has been silicon dioxide; however, the dielectric constant (k) of silicon dioxide deposited by chemical vapor deposition is on the order of 4.1 to 4.2. The dielectric constant is based on a scale where 1.0 represents the dielectric constant of a vacuum. Silicon dioxide provides a minimal thermal expansion coefficient mismatch with conductive layer materials, and is a strong material.

Low-k materials (e.g., having a dielectric constant of 3.6 or less) are now being used for the insulating material separating conductive layers and metal leads of semiconductor devices in order to reduce the capacitive coupling between interconnect lines. Widely used low-k materials comprise organic spin-on materials, which must be heated to remove the liquid, or solvent. Often these low-k materials have a high thermal expansion coefficient compared to metals and silicon dioxide.

Semiconductor wafers are frequently temperature-cycled during fabrication due to the nature of the manufacturing process. When a device comprises multiple metallization and dielectric layers, the solvent-removing heating step for the low-dielectric constant material layers must be repeated numerous times (e.g., each layer must be cured), which can be problematic, especially for the lower layers of the device. The mismatch of thermal expansion coefficients of metal leads and low-k dielectric layers causes thermo-mechanical stress, leading to increased resistances, delaminations, electrical intermittencies and opens, resulting in reduced yields.

What is needed in the art is an interconnect structure and fabrication method thereof that can withstand the thermal cycling required for processing multi-layer semiconductor devices having a low-k insulating material between conductive layers.

SUMMARY OF THE INVENTION

These problems are generally solved or circumvented by the present invention, which achieves technical advantages as a barbed via structure and method of fabrication thereof that provides strength, robustness and stabile electrical resistance to metal interconnect layers of a multi-layer semiconductor device.

Disclosed is a method of interconnecting conductive layers in a multi-layer integrated circuit, the integrated circuit comprising a first conductive line in a first dielectric layer and a second conductive line in a second dielectric layer, the second conductive line and second dielectric layer residing over the first conductive line and first dielectric layer, respectively. The method comprises depositing a second dielectric layer over the first conductive line and the first dielectric layer, and forming a via opening over the first conductive line in the second dielectric layer. In the second dielectric a trench for the second conductive line and the via opening are formed by subsequent patterning steps, in a dual damascene approach. The via may be formed first and trench second or alternatively, the trench may be formed first and the via formed second. A barb opening is formed in a top portion of the first conductive line, the barb opening having a region extending beneath the second dielectric layer. The via opening, the barb opening and the trench opening for the second conductive line are filled with a conductive material to form a barbed via with a conductive line on top, wherein the barbed via provides electrical connection between the first conductive line and the second conductive line.

Also disclosed is a method of manufacturing interconnect layers of a multi-layer integrated circuit in a single damascene approach, comprising forming a first conductive line in a first dielectric layer, depositing a second dielectric layer over the first conductive line and the first dielectric layer, and forming a via opening over the first conductive line in the second dielectric layer. A barb opening is formed in a top portion of the first conductive line, the barb opening having a region extending beneath the second dielectric layer. The via opening and the barb opening are filled with a conductive material to form a barbed via, and a third dielectric layer is deposited over the barbed via and the second dielectric layer. A second conductive line is formed in the third dielectric layer over the barbed via.

Further disclosed is an interconnect structure for a multi-layer integrated circuit, comprising a first conductive line formed in a first dielectric layer, a second dielectric layer deposited over the first dielectric layer and the first conductive line, and a barbed via formed in the second dielectric layer over the first conductive line. The barbed via has a barbed portion extending into a top portion of the first conductive line, with the barbed portion having a portion extending beneath the first conductive line. A third dielectric layer is deposited over the second dielectric layer and the barbed via, and a second conductive line is formed in the third dielectric layer above the barbed via (single damascene approach) or alternatively the second conductive line may be realized in the second dielectric layer and filled together with the barbed via by the same deposition steps of the conductive liners, seed layers and metal fills (dual damascene approach).

Advantages of the invention include preventing delamination, breakage and opens from occurring during thermal expansion in multi-level interconnect structures due to materials having different thermal expansion coefficients. The barbed vias of the present invention provide a sturdy, robust, structure that can withstand the thermal cycling during the multiple times a wafer is exposed to high temperatures in order to cure low-dielectric constant insulating materials and during other processing steps. The invention results in improved yields and lowered electrical resistance value of vertical connections within the wafer.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Problems with prior art via formation will be discussed, followed by a description of preferred embodiments of the present barbed via invention. Advantages of the invention will then be discussed. The term "via" is used herein to describe a portion, e.g. a plug or line, of conductive material placed between conductive layers of a semiconductor integrated circuit (IC) to provide an electrical and mechanical path for current to flow during the operation of the IC. Only one via is shown in each figure, although many vias are present within each dielectric layer.

Figure 1:
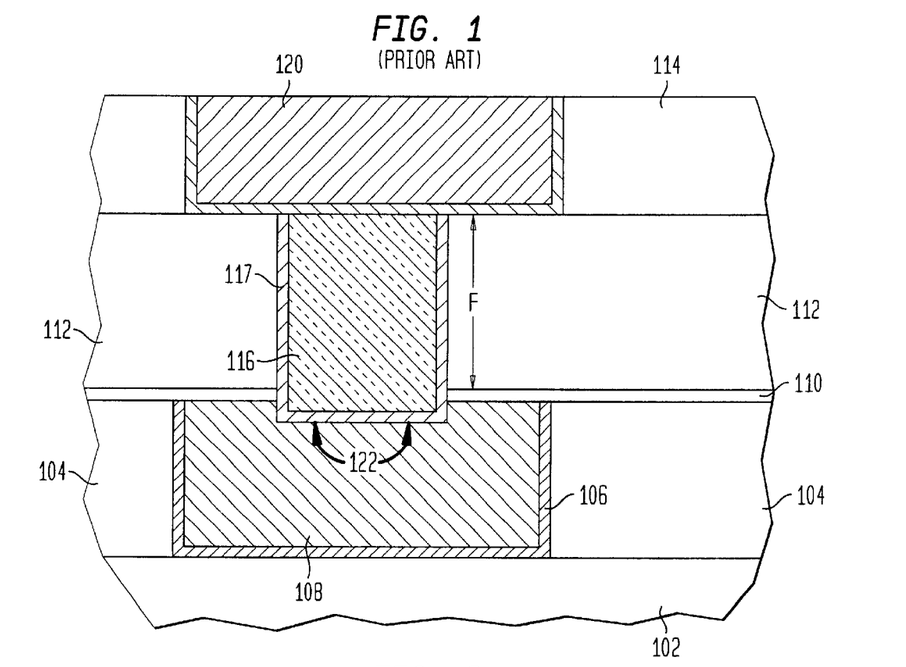
FIG. 1 illustrates a cross-sectional view of a prior art integrated circuit structure having vias connecting conductive lines of the various conductive layers in a single damascene approach.
Figure 2:
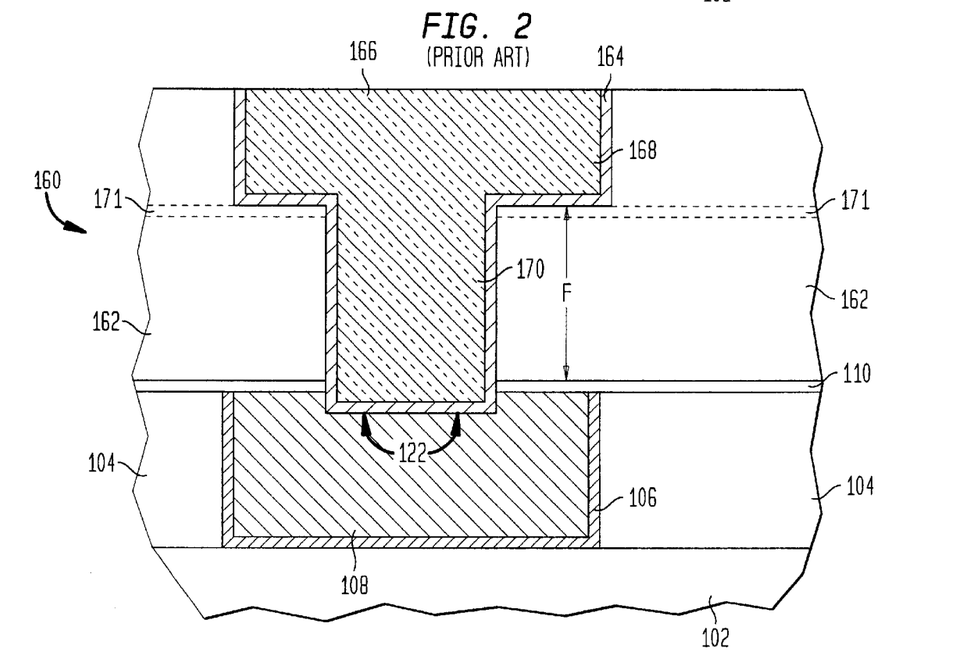
FIG. 2 illustrates a cross-sectional view of a prior art integrated circuit structure having vias connecting conductive lines of the various conductive layers in a dual damascene approach.

FIGS. 1 and 2 show prior art structures 100 and 160 for prior methods of fabricating multi-layer interconnects of an integrated circuit on a semiconductor wafer. FIG. 1 shows a single damascene approach and FIG. 2 shows a dual damascene approach.

Referring first to the structure 100 shown in FIG. 1, a substrate 102 is provided, typically comprising silicon oxide over single-crystal silicon. The substrate 102 may include other conductive layers or other semiconductor elements, e.g. transistors, diodes, etc. Compound semiconductors such as GaAs, InP, Si/Ge, SiC are often used in place of silicon.

A first dielectric layer 104 is deposited over the substrate 102. In the prior art structure having the problems described herein, dielectric 104 comprises a low-dielectric constant material, having a dielectric constant k of 3.6 or less, for example. Low-k dielectric material 104 comprises an organic spin-on material such as a polyimid or others. Trademarks for such materials include Dow Chemical Corporation's SiLK™ and AlliedSignal Inc.'s Flare™ for example. After spinning on low-k dielectric 104, the wafer 100 is exposed to a heating step (e.g., baked) to remove the solvents and cure the dielectric material. Temperatures of the heating step may reach 400 degrees C., for example.

Dielectric material 104 is patterned and etched, and conductive lines 108 are formed. An optional conductive liner 106 may be deposited prior to formation of conductive lines 108. Conductive liner 106 typically comprises Ta, TaN, WN, TiN, etc., and conductive lines 108 may comprise conductive materials such as aluminum, copper, other metals, or combinations thereof, for example.

An optional dielectric cap layer 110 comprising SiN, for example, is deposited over conductive lines 108 and low-k dielectric 104. A second layer of dielectric material 112 is deposited over conductive lines 108. Second dielectric layer 112 comprises a low-k material and thus must be baked at up to 400 degrees C. to remove solvents. Dielectric layer 112 is patterned e.g. with a mask, and via openings are formed using an etch process step, preferably an anisotropic etch process which is substantially directed towards the perpendicular surface of the wafer. A small portion of the tops of conductive lines 108 is typically etched during the anisotropic etch process, as shown by the recess at 122.

The via openings are filled with a metallic material, preferably the same as the material used for the conductive lines 108, for example, to form vias 116. Vias 116 are typically substantially cylindrical, and may have a slightly greater diameter at the tops than at the bottoms due to the via opening etch process not being entirely perpendicular to the wafer 100 surface.

A third dielectric layer 114 comprising a low-k dielectric material, for example, is deposited over vias 116, heated to remove the solvents, patterned and etched. Conductive lines 120 are formed over vias 116 to provide a connection to conductive lines 108 in the underlying first dielectric layer 104. An optional conductive liner 118 may be deposited prior to the formation of conductive lines 120. Conductive lines 120 preferably comprise a metal material the same as conductive lines 108, for example. Many other conductive layers may be deposited in this manner. It is not uncommon to have up to six conductive layers within a semiconductor structure.

FIG. 2 shows generally at 160 a prior art dual damascene approach of forming multi-layer interconnects of an integrated circuit. A substrate 102 is provided, and a first dielectric layer 104 is deposited over the substrate 102. Dielectric material 104 may comprise a low-k dielectric. Dielectric material 104 is patterned and etched, and conductive lines 108 are formed. An optional conductive liner 106 may be deposited prior to formation of conductive lines 108.

An optional dielectric cap layer 110 is deposited over conductive lines 108 and low-k dielectric 104. A second layer of dielectric material 162 is deposited over conductive lines 108. In a dual damascene approach, second dielectric layer 162 is thicker than in a single damascene approach, because both via 170 and metal line 168 are formed within the second dielectric layer 162. Alternatively, an etch stop material 171 may be deposited near the interface of the via 170 and metal line 168, as shown in phantom.

Dielectric layer 162 is patterned and etched, generally in two separate steps to form via 170 holes and trenches for metal lines 168. The etching processes are usually anisotropic etch processes that are substantially directed towards the perpendicular surface of the wafer. The via 170 hole may be formed first, followed by the formation of metal line 168 trench, or vice versa. A liner 164 may be deposited over the via hole and the metal line trench. The via openings and metal line trench are filled with a metallic material, preferably the same as the material used for the conductive lines 108, for example, to form vias 170 and metal lines 168.

A problem with the prior art structures shown in FIGS. 1 and 2 is that after each low-dielectric constant material layer deposition, the organic spin-on material must be heated to remove the solvent. This means that the lower layers, e.g. the ones first deposited, are heated six or more times to 400 degrees C. This thermal cycling causes a greater expansion of the low-k dielectric material 112/162 than the expansion of conductive via 116/170, causing force F to be exerted downwards and upwards towards conductive lines 108 and 120/168, respectively. Conductive lines 108 and 120/168 have a much lower coefficient of thermal expansion than dielectric 112/162. For example, the coefficient of thermal expansion is 16–17 ppm/degrees C. for copper, compared with low-k dielectric material SiLK™ which has a coefficient of thermal expansion of 60–70 ppm/degree C. Each time the wafer 100/160 is heated, the low k material 112/162 expands. The thermal mismatch between the vias 116/170 and dielectric layer 112/162 causes an increase in the resistance of the conductive path created by 108, 116/170 and 120/168. In particular, the junction 122 of conductive line 108 with via 116/170 is stressed due to the expansion of dielectric layer 112/162, and junction 122 may separate partially or completely, resulting in open electrical connections or in intermittent electrical connections. This can cause an increase in electrical resistance, and result in decreased semiconductor device production yields or possibly failures during test or later on in use.

The prior art problem of faults, reduced yields and increased resistance of conductive lines are reduced or alleviated with the present invention, in which the tops of the bottom conductive lines are etched beneath the via dielectric layer with an isotropic etch so that a barbed via is formed.

Figure 3:
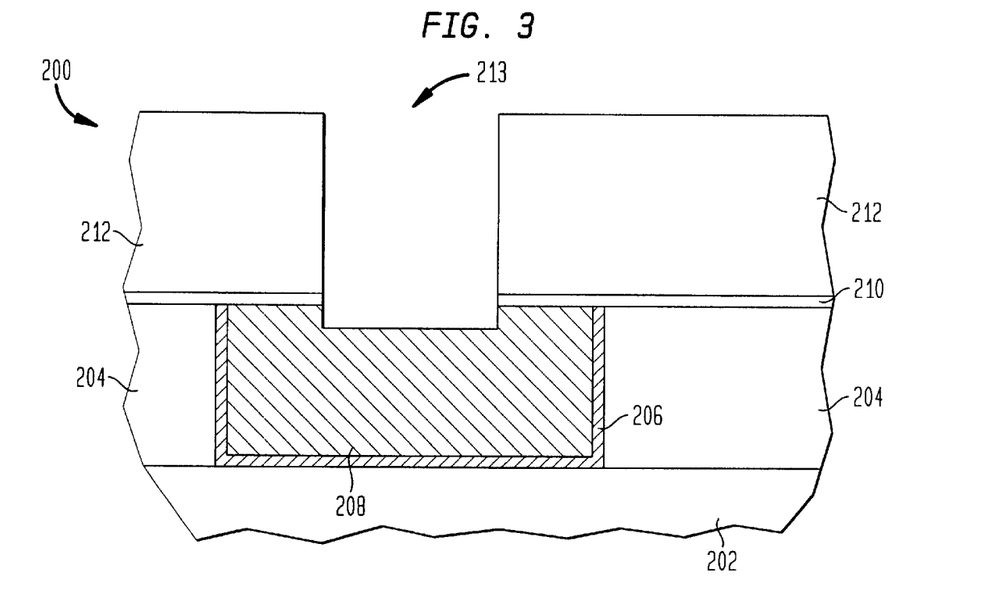
FIGS. 3–5 show cross-sectional views of an integrated circuit structure in accordance with a preferred embodiment of the present invention at various stages of fabrication in a single damascene approach.

FIGS. 3–6 show a preferred embodiment 200 of the present invention in a single damascene approach at various manufacturing process stages and a flow chart 240 of a single damascene fabrication method for barbed vias between conductive lines of an integrated circuit. Referring first to FIG. 3, a substrate 202 is provided, preferably comprising silicon oxide over, and possibly abutting, single-crystal silicon. The substrate 202 may include other conductive layers or other semiconductor elements, e.g. transistors, diodes, etc. Compound semiconductors such as GaAs, InP, Si/Ge, SiC may alternatively be used in place of silicon.

A dielectric layer 204 is deposited over the substrate 202. Dielectric 204 preferably comprises a low-dielectric constant material, having a dielectric constant k of 3.6 or less, for example. Low-k dielectric material 204 preferably comprises an organic spin-on material such as a polyimid. Trademarks for such materials include SiLK™ and Flare™. Alternatively, a non-low-k dielectric such as silicon dioxide and/or silicon nitride (e.g., $Si_3N_4$) may be used. After spinning-on low-k dielectric 204, the wafer 200 is exposed to a heating step (baked) of about 400 degrees C. to remove the solvents.

Figure 6:
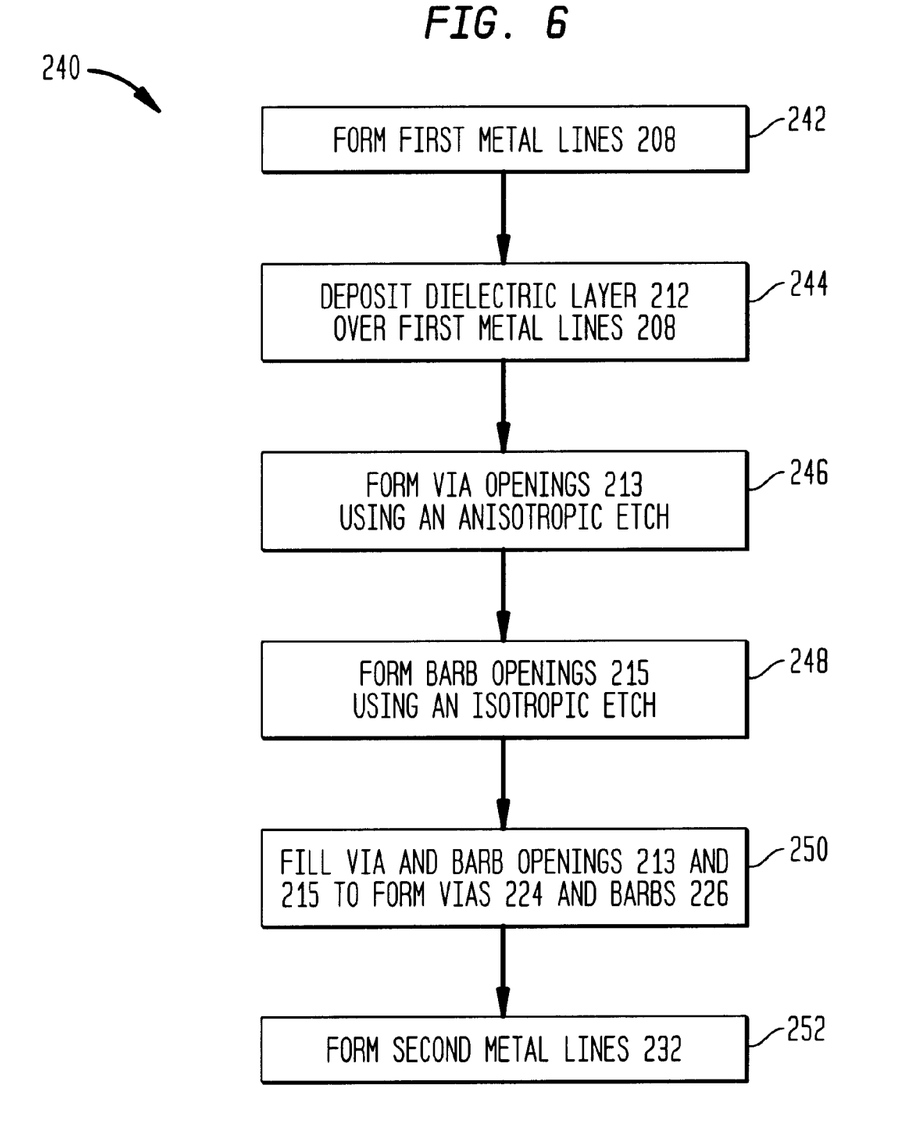
FIG. 6 shows a flow chart for a preferred method of fabricating a barbed via of the present invention.

Dielectric material 204 is patterned and etched, and conductive lines or regions 208 are formed (step 242 of FIG. 6). An optional conductive liner 206 may be deposited prior to formation of conductive lines 208. Conductive liner 206 typically comprises Ta, TaN, WN, TiN, etc., and conductive lines 208 preferably comprise copper, although aluminum, other metals and combinations thereof may also be used. Conductive lines 208 are preferably formed by a damascene or dual damascene process, for example.

An optional dielectric cap layer 210 preferably comprising SiN, and alternately comprising Trademark BloK™ or other dielectric diffusion barriers may be deposited over conductive lines 208 and low-k dielectric 204. Dielectric cap layer 210 may not be required when conductive lines 208 comprise aluminum, for example. A second layer of dielectric material 212 is deposited over conductive lines 208 (step 244 of FIG. 6). Dielectric layer 212 preferably comprises a low-k material and will typically be baked at up to 400 degrees C. to remove solvents. Alternatively, dielectric layer 212 may comprise conventional dielectrics such as silicon dioxide and/or silicon nitride, for example.

Dielectric material 212 is patterned via lithography e.g. with a mask, and via openings 213 are formed (step 246 of FIG. 6) using an etch process step, preferably an anisotropic etch process in which the etchant material or gas is substantially directed towards the perpendicular surface of the wafer to create vertical sidewalls. A small portion of the top of conductive lines 208 is etched during the anisotropic etch process, as shown by the recess in FIG. 3. Anisotropic etch process preferably involves placing a photomask over the exposed dielectric 212 surface and exposing the wafer 200 to an oxygen, nitrogen or combination thereof, or alternatively $CHF_3$ with a small amount of $O_2$, for example. Resist or polymer is removed as part of the anisotropic etch process. Typically, the anisotropic etch stops in or on the top surface of the lower conductive line 208.

Figure 4:
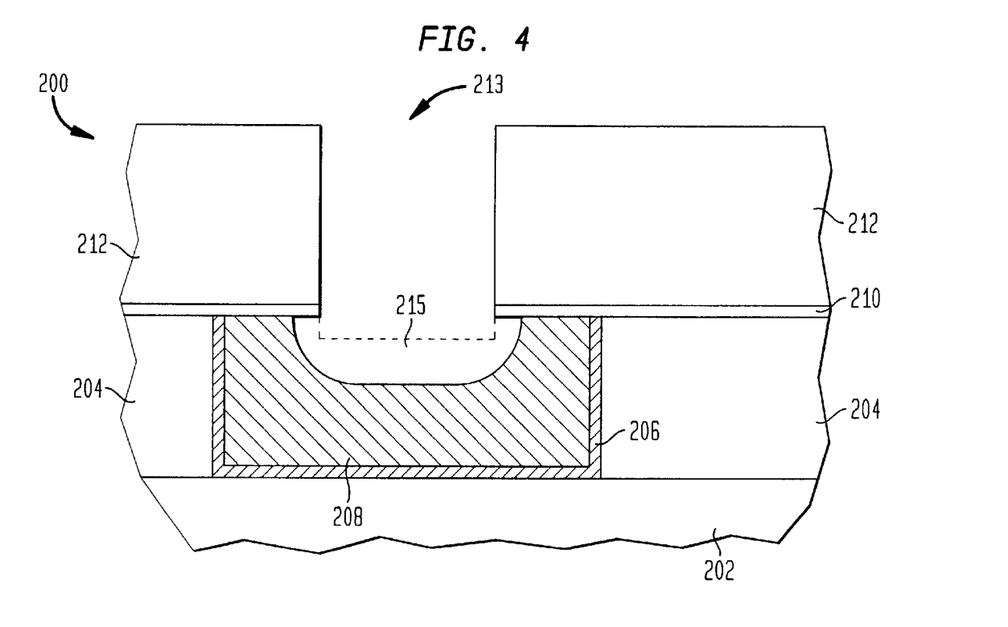

Referring to FIG. 4, a second etch process is performed to form a rounded cavity or opening 215 in the top of conductive leads 208 (step 248 of FIG. 6). Preferably the second etch process comprises an isotropic etch so that opening 215 is undercut beneath dielectric layer 212 as shown. Opening 215 comprises a cavity where a barbed portion will be formed when the via opening 213 is filled in a subsequent processing step or steps. The isotropic etch step 248 preferably comprises a wet etch such as ammonium persulfat ($NH_4$ with some $SO_4$), sulfuric acid or a mixture thereof, for example, and may alternately comprise a dry etch using chlorine chemistries at an elevated temperature, above 200 degrees C., for example.

Figure 5:
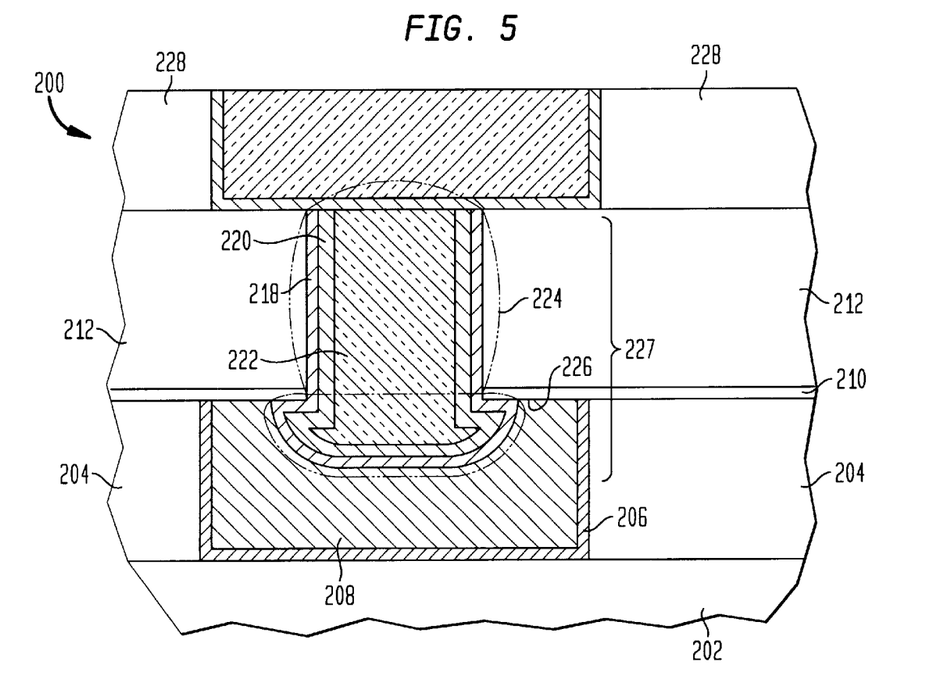

Referring to FIG. 5, via 213 and barb 215 (of FIG. 4) openings are filled to form barbed vias 227 having a substantially cylindrical portion 224 within the second dielectric layer 212 and a barbed portion 206 within conductive lines 208 (step 250). Preferably, this is accomplished in multiple steps as follows.

A conformal deposition process is performed to leave conformal liner/diffusion barrier 218 along the interior walls of via opening 213 and the barb opening 215. Preferably conformal liner 218 comprises titanium nitride deposited by chemical vapor deposition (CVD), and may alternatively comprise tantalum nitride, tungsten nitride, or other barrier layers that may be conformally deposited, for example, using CVD processes or electro-less plating. A conformal seed layer 220 is then deposited, which preferably comprises copper, aluminum or other metals or combinations thereof. Conformal seed layer 220 is preferably deposited using a CVD process or other process resulting in a conformal seed layer 220, for example. The remainder of openings 213 and 215 are filled with material 222, for example, using an electroplated fill process to create void-free vias 227 having a cylindrical portion 224 and a barbed portion 226. Material 222 preferably comprises copper, aluminum or other metals or combinations thereof. Alternatively, material 222 may be deposited using CVD or physical (non-conformal) vapor deposition (PVD) followed by a reflow process.

A third dielectric layer 228, preferably comprising a low-k dielectric layer 228, is deposited over barbed vias 227, heated to remove the solvents, and patterned. Alternatively, a non-low-k dielectric such as silicon dioxide and/or silicon nitride may be used. Conductive lines or regions 232 may be formed within dielectric layer 228 and over barbed vias 227 (step 252 of FIG. 6) to connect to conductive lines 208 in the underlying layer. An optional conductive liner 230 may be deposited prior to the formation of conductive lines 232. Conductive lines 232 preferably comprise a metal material the same as conductive lines 208, such as copper, aluminum or a combination thereof, for example. Many, e.g. six or more, other conductive layers with barbed vias 227 connecting them may be deposited in this manner in accordance with the present invention.

Figure 7:
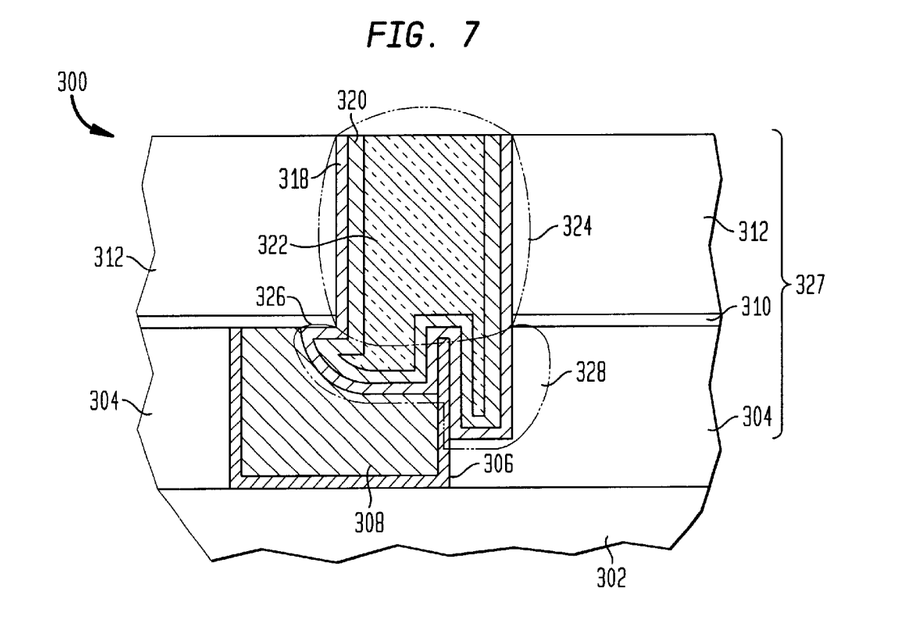
FIG. 7 illustrates another preferred embodiment of the present invention having a barbed via on one side, in a structure where the vias and contacts are not fully landed or in contact with one another.

An alternate embodiment of the present invention is shown in cross-section in FIG. 7. In some integrated circuit designs, vias may not contact the underlying conductive lines in the center of the conductive lines, but rather may be slightly misplaced and make contact at the edge of the conductive lines 322. This is sometimes referred to as a non-fully landed contact/via. The barbed via of the present invention disclosed herein is beneficial to such structures, as shown in FIG. 7 at 300. A dielectric 304 preferably comprising a low-dielectric constant material is deposited over the substrate 302, and the wafer 300 is exposed to a heating step (baked) of about 400 degrees C. to remove the solvents.

Dielectric material 304 is patterned and etched, and conductive lines or regions 308 are formed. Optional conductive liner 306 may be deposited prior to formation of conductive lines 208. A dielectric cap layer 310 is deposited over conductive lines 308 and low-k dielectric 304. A second layer of dielectric material 312 is deposited over conductive lines 308. Dielectric material 312 is baked to remove solvents. Dielectric material 312 is patterned, and via openings are formed using an etch process step, preferably an anisotropic etch process. A top portion of conductive lines 308 is etched during the anisotropic etch process.

Next, a second etch process is performed to form a cavity or opening in the top of conductive lines 308 and in dielectric 304 adjacent the side of the conductive line 308. Preferably, the second etch process comprises an isotropic etch so that the barb opening is undercut beneath dielectric layer 312.

Via and barb openings are filled to form vias 327 having a cylindrical portion 324 and barbed portion 328. Preferably, this is accomplished in multiple steps as follows. A conformal deposition process and is performed to leave conformal liner/diffusion barrier 318 along the interior walls of via and barb openings. A conformal seed layer 320 is then deposited, and the remainder of the openings are filled with material 322, for example, using an electroplated copper process to obtain void-free vias 327 having a cylindrical portion 324 and a barbed portion 326. Conductive lines or regions are then formed in a third dielectric layer deposited over vias 327, not shown (single damascene approach) or have been formed in the same second dielectric layer 312 before the via fill (dual damascene approach).

Figure 8:
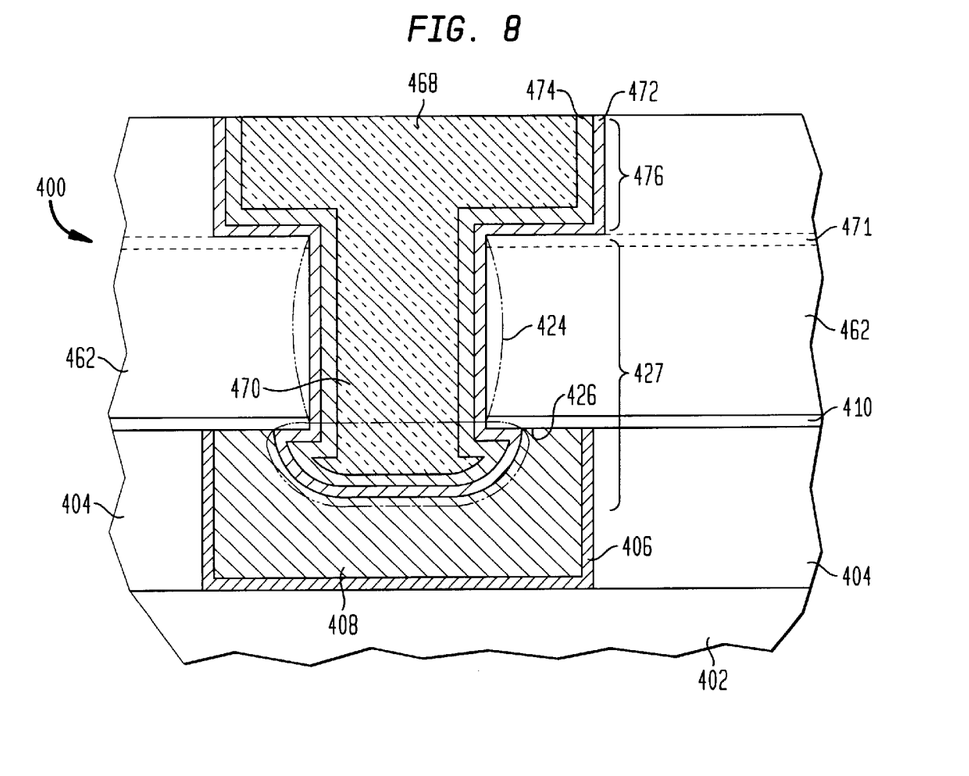
FIG. 8 shows a cross-sectional view of an integrated circuit structure in accordance with a preferred embodiment of the present invention in a dual damascene approach.

FIG. 8 shows another preferred embodiment 400 of the present invention that uses a dual damascene approach to fabricate barbed vias between conductive lines of an integrated circuit. A substrate 402 is provided, and a dielectric layer 404 is deposited over the substrate 402. Dielectric 404 preferably comprises a low-dielectric constant material. Dielectric material 404 is patterned and etched, and conductive lines or regions 408 are formed. An optional conductive liner 406 may be deposited prior to formation of conductive lines 408.

An optional dielectric cap layer 410 may be deposited over conductive lines 208 and low-k dielectric 404. Dielectric cap layer 410 may not be required when conductive lines 408 comprise aluminum, for example. A second layer of dielectric material 462 is deposited over conductive lines 408.

In the dual damascene approach shown, second dielectric layer 462 is thicker than in the single damascene approach, because via 470 and metal line 468 are formed within a single second dielectric layer 462, as shown. Alternatively, an etch stop material 471, shown in phantom, may be deposited near the interface of the via 470 and metal line 468. Dielectric layer 462 preferably comprises a low-k material, and alternatively may comprise more conventional dielectrics. Dielectric material 462 is patterned to form via 470 opening and a trench for metal line 468, preferably, in separate patterning and etch process steps, e.g., first the via 470 opening is formed and then the trench for metal line 468 is formed, or vice versa. The etch process is preferably an anisotropic etch process in which the etchant material or gas is substantially directed towards the perpendicular surface of the wafer to create vertical sidewalls. A small portion of the top of conductive lines 408 may be etched during the anisotropic etch process. Typically, the anisotropic etch stops in or on the top surface of the lower conductive line 408.

In accordance with the present invention, a second etch process is performed to form a rounded cavity or opening in the top of conductive leads 408. Preferably the second etch process comprises an isotropic etch so that opening is undercut beneath dielectric layer 462, as shown. The second etch process is selective to the conductive lead 408 material. The curved opening comprises a cavity where a barbed portion 426 will be formed when the via opening is filled in a subsequent processing step or steps. The isotropic etch step preferably comprises a wet etch such as ammonium persulfat ($NH_4$ with some $SO_4$), sulfuric acid or a mixture thereof, for example, and may alternately comprise a dry etch using chlorine chemistries at an elevated temperature, above 200 degrees C., for example.

The via and barb openings are filled to form barbed vias 470 having a substantially cylindrical portion 424 within the second dielectric layer 462 and a barbed portion 426 within conductive lines 408. Preferably, this is accomplished in multiple steps as follows.

A conformal deposition process is performed to leave conformal liner/diffusion barrier 472 along the interior walls of the via opening, the barb opening, and the metal line trench. Preferably, conformal liner 472 comprises titanium nitride deposited by chemical vapor deposition (CVD), and may alternatively comprise tantalum nitride, tungsten nitride, or other barrier layers that may be conformally deposited, for example, using CVD processes or electro-less plating. A conformal seed layer 474 is deposited, preferably comprising copper, aluminum or other metals or combinations thereof. Conformal seed layer 474 is preferably deposited using a CVD process or other process resulting in a conformal seed layer 474, for example.

The remainder of the via, barb, and trench openings are filled with a conductive material, for example, using an electroplated fill process to create void-free vias 427 having a cylindrical portion 424 and a barbed portion 426 and also filling the metal lines 468. The conductive material filling vias 427 and metal lines 468 preferably comprises copper, aluminum or other metals or combinations thereof. Alternatively, the conductive material may be deposited using CVD or physical (non-conformal) vapor deposition (PVD) followed by a reflow process. In this particular embodiment, the trenches for the second conductive line are patterned in the second dielectric layer 462 before filling the barbed vias, so that the metal line 468 and barbed via 427 are filled at the same time, in a dual damascene approach. Many, e.g. six or more, other conductive layers with barbed vias 427 connecting them may be deposited in this manner in accordance with the present invention.

A structure with a non-fully landed contact/via such as the one shown in FIG. 7 may also be fabricating using the dual damascene approach as described for FIG. 8 in accordance with the present invention, not shown.

The novel circuit and method disclosed herein achieves technical advantages as an interconnect structure and method of fabrication thereof for connecting conductive layers of a multi-layer integrated circuit with improved mechanical strength. The barbed vias of the preferred embodiment prevent delamination, separation, breakage and opens from occurring between vias 227/327/427 and underlying conductive lines 208/308/408 during thermal expansion; for example, during the multiple times the wafer is exposed to extreme heat during removal of low-dielectric constant insulating material solvents, layer deposition, final anneal, or dielectric cure. The use of the present embodiment barbed vias results in improved yields and lowered electrical resistance value of vertical connections within the wafer. The barbed portion 226/326/426 of the vias 227/327/427 provides a larger surface area for via 227/327/427 to connect underlying conductive line 208/308/408, stabilizing the thermal expansion effects. The invention also results in improved electrical reliability of the vertical chain of conductive lines 208/308/408, 232/468 and vias 227/327/427.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, while a damascene process has been described herein to describe the conductive line formation, a non-damascene process may be used. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of interconnecting conductive layers in a multi-layer integrated circuit, wherein the method comprises:

depositing a low-dielectric constant material dielectric layer over a first copper conductive region;

forming a via opening over a least a portion of the first conductive region in the dielectric layer;

forming a barb opening in a top portion of the first conductive region, the barb opening having a region extending beneath the dielectric layer;

depositing a conformal conductive liner on the via and barb openings, including on an exposed underside of said dielectric layer; and depositing a copper metal fill layer over the conformal conductive liner to form a barbed via.

2. The method according to claim 1 wherein depositing the dielectric layer comprises depositing a material having a dielectric constant of 3.6 or less.

3. The method according to claim 1 wherein depositing a metal fill layer over the conformal conductive liner further comprises depositing a conformal seed layer over the conformal conductive liner.

4. The method according to claim 1 wherein depositing the metal fill layer comprises electroplating a metal.

5. The method according to claim 1 wherein forming the via opening comprises exposing the dielectric layer to an anisotropic etch.

6. The method according to claim 1 wherein forming the barb opening comprises exposing the top portion of the first conductive region to an isotropic etch.

7. The method according to claim 1 wherein forming the barb opening comprises forming an opening having a region extending beneath the dielectric layer near at least approximately one-half of the via opening diameter.

8. The method according to claim 7 wherein the region extending beneath the dielectric layer is near approximately the vi opening diameter.

9. A method of manufacturing interconnect layers of a multi-layer integrated circuit, comprising:

forming a first copper conductive region in a first dielectric layer;

depositing a second dielectric layer over the first conductive region and the first dielectric layer, wherein the second dielectric layer composing is a low-dielectric constant material;

forming a via opening over he first conductive region in the second dielectric layer; forming a barb opening in top portion of the first conductive region, the barb opening having a region extending beneath he second dielectric layer;

depositing a conformal conductive liner on the via and barb openings, including on an exposed underside of said second dielectric layer; and depositing a copper metal fill layer over the conformal conductive liner to form a barbed via.

10. The method according to claim 9, further comprising:

depositing a third dielectric layer over the barbed via and the second dielectric layer; and forming a second conductive region in the third dielectric layer over the barbed via.

11. The method according to claim 9, further comprising:

depositing a third dielectric layer over the second dielectric layer before forming the via opening; and forming a trench for a second conductive region in the third dielectric layer before forming the via opening;

wherein depositing the conformal conductive liner on the via and barb openings also comprises depositing a conformal liner in the trench for the second conductive region; and wherein depositing the metal fill layer on the conformal conductive liner also comprises depositing a metal fill layer on the conformal liner in the trench for the second conductive region to form the second conductive region.

12. The method according to claim 9 wherein depositing the metal fill layer over the conformal conductive liner further comprises depositing a conformal seed layer over the conformal conductive liner.

13. The method according to claim 9 wherein depositing the metal fill layer comprises electroplating a metal.

14. The method according to claim 9 wherein forming the via opening comprises exposing the second dielectric layer to an anisotropic etch.

15. The method according to claim 9 wherein forming the barb opening comprises exposing the top portion of the first conductive region to an isotropic etch.

16. The method according to claim 9 wherein forming the barb opening comprises forming an opening having a region extending beneath the second dielectric layer near at least approximately one-half of the via opening diameter.

17. The method according to claim 16 wherein the region extending beneath the second dielectric layer is near approximately the via opening diameter.

* * * * *

UNITED STATES PATENT AND TRADEMARK OFFICE
CERTIFICATE OF CORRECTION

PATENT NO. : 6,613,664 B2
DATED : September 2, 2003
INVENTOR(S) : Barth et al.

It is certified that error appears in the above-identified patent and that said Letters Patent is hereby corrected as shown below:

<u>Column 9,</u>
Line 60, delete "vi" and substitute -- via --.

<u>Column 10,</u>
Line 8, delete "composing".
Line 10, delete "he" and substitute -- the --.
Line 11, begin new paragraph with the word "forming".
Line 11, insert -- a -- after "in".
Line 13, delete "he" and substitute -- the --.

Signed and Sealed this

Twenty-third Day of December, 2003

JAMES E. ROGAN
*Director of the United States Patent and Trademark Office*